(12) United States Patent
Qiu et al.

(10) Patent No.: US 12,055,582 B2
(45) Date of Patent: Aug. 6, 2024

(54) SENSOR DEVICE FOR DETECTING ELECTRICAL DEFECTS BASED ON RESONANCE FREQUENCY

(71) Applicant: Keysight Technologies, Inc., Santa Rosa, CA (US)

(72) Inventors: Tie Qiu, Singapore (SG); Daniel Mak, Singapore (SG); Andrew Tek, Singapore (SG); Manish Prajapati, Singapore (SG); Shaoying Huang, Singapore (SG)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 48 days.

(21) Appl. No.: 17/513,963

(22) Filed: Oct. 29, 2021

(65) Prior Publication Data

US 2023/0136914 A1    May 4, 2023

(51) Int. Cl.
*G01R 27/26* (2006.01)
*G01R 31/28* (2006.01)
*G01R 1/067* (2006.01)

(52) U.S. Cl.
CPC ......... *G01R 31/2837* (2013.01); *G01R 27/26* (2013.01); *G01R 31/2806* (2013.01); *G01R 31/2841* (2013.01); *G01R 1/06772* (2013.01)

(58) Field of Classification Search
CPC .... G01R 31/2837; G01R 31/28; G01R 27/26; G01R 31/2806; G01R 31/2841; G01R 1/06772; G01R 1/067
See application file for complete search history.

(56) References Cited

U.S. PATENT DOCUMENTS

| 6,947,853 B2 | 9/2005 | Yamaoka |
| 11,137,417 B2 | 10/2021 | Qiu et al. |

(Continued)

FOREIGN PATENT DOCUMENTS

| CN | 101107537 B | * 6/2010 | ......... G01R 31/2812 |
| CN | 101107537 B | 6/2010 | |

(Continued)

OTHER PUBLICATIONS

English translation of CN101107537B, 31 pgs.

(Continued)

*Primary Examiner* — Tarun Sinha
*Assistant Examiner* — James I Burris

(57) ABSTRACT

A sensor device is provided for detecting electrical defects in a device under test (DUT). The sensor device includes a signal line configured to conduct a stimulus signal through a first conductor in the DUT; an inductor connected in series with the signal line for providing an inductance; and a ground line arranged adjacent to the signal line and configured to provide a ground path through a second conductor in the DUT for the stimulus signal conducted through the signal line and the first conductor. A resonance frequency for the signal line is determined based on the inductance and an effective capacitance of the signal line generated in response to the stimulus signal. An increase in the resonance frequency indicates an open defect in the first conductor and/or the second conductor, and a decrease in the resonance frequency indicates a short defect between the first conductor and the second conductor.

20 Claims, 8 Drawing Sheets

(56) References Cited

U.S. PATENT DOCUMENTS

| | | | | |
|---|---|---|---|---|
| 2008/0012578 A1* | 1/2008 | Campbell | ............ | G01N 27/221 |
| | | | | 324/633 |
| 2013/0021050 A1* | 1/2013 | Chui | ................. | G01R 1/06772 |
| | | | | 324/754.03 |
| 2017/0101315 A1* | 4/2017 | Cathell | ................. | C01B 13/115 |
| 2019/0305592 A1* | 10/2019 | Vannucci et al. | ......... | H01P 3/16 |
| 2020/0088785 A1* | 3/2020 | Suto | ........................ | H01L 24/49 |

FOREIGN PATENT DOCUMENTS

| | | | | |
|---|---|---|---|---|
| FR | 2771181 A1 * | 5/1999 | ......... | G01R 31/2841 |
| WO | 2020055772 A1 | 3/2020 | | |

OTHER PUBLICATIONS

Tie Qiu et al., A Compact High-Resolution Resonance-Based Capacitive Sensor for Defects Detection on PCBAs, IEEE Access, Nov. 9, 2020, pp. 1-11.
Chinese Office Action dated Jun. 2, 2023, Application No. 202222849843.1, 2 pgs.
English translation of Chinese Office Action dated Jun. 2, 2023, 3 pgs.

* cited by examiner

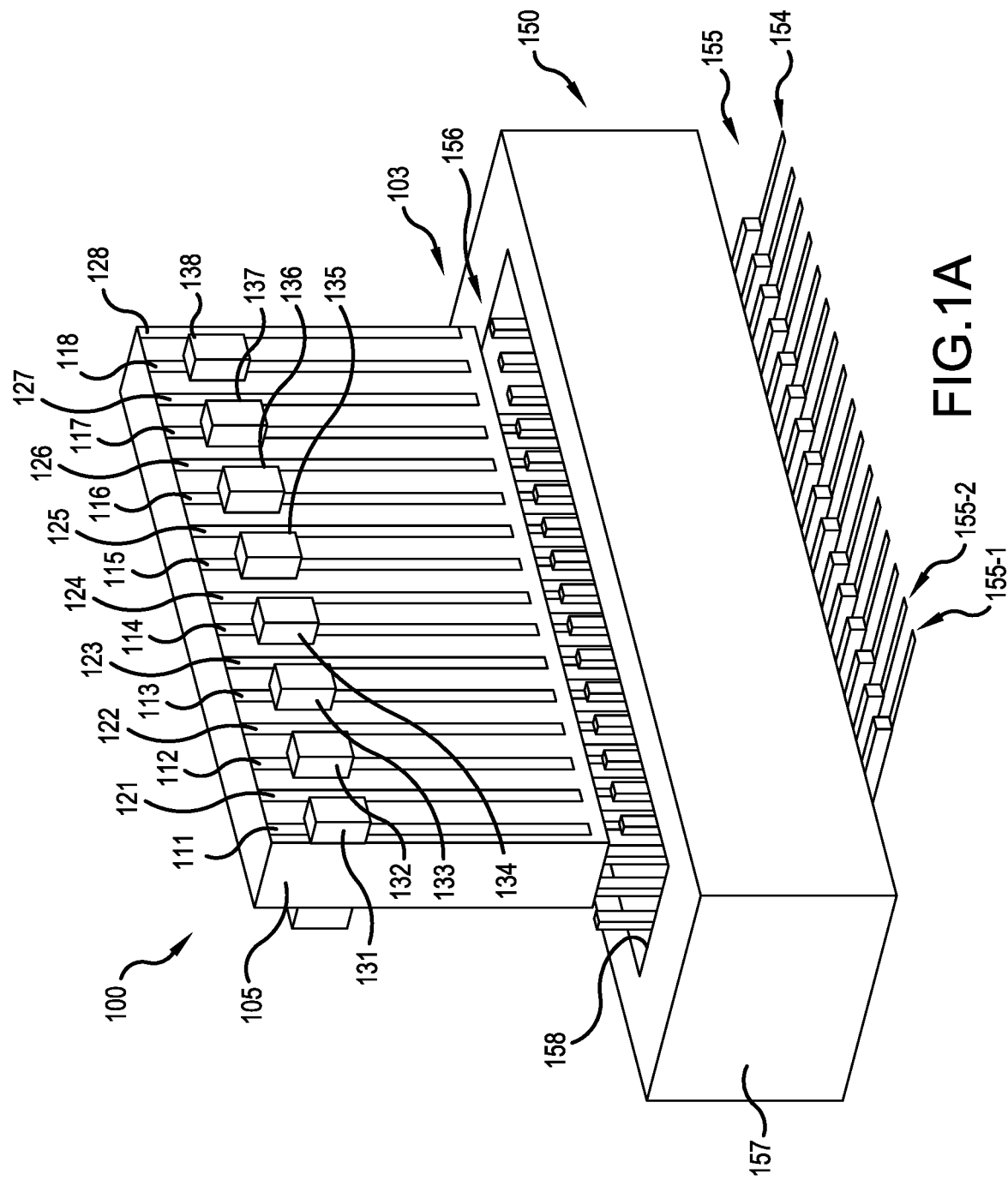

SENSOR DEVICE FOR DETECTING ELECTRICAL DEFECTS BASED ON RESONANCE FREQUENCY

BACKGROUND

Electronics manufacturers rely on functional testing and in-circuit testing (ICT) of electronic devices to provide sufficient test coverage. Functional testing enables fault detection within the electronic products, generally, but does not identify particular components and/or electrical connections within the electronic products when a defective product is identified. This results in numerous failed electronic products being scrapped, to the extent the specific cause of failure cannot be identified, resulting in significant waste and negative environmental impact. ICT enables fault detection, and is able to identify the components (including pins) and/or electrical connections responsible for detected faults. However, ICT depends on availability of test access, e.g., in the form of test pads on a printed circuit board assemblies (PCBAs) or other electronic circuit of a device under test (DUT).

Modern PCBAs typically contain multiple board-to-board or wire-to-board connectors for PCBs of the PCBAs, which provide design flexibility, are easy to repair, and enable easy upgrades to a system. Common types of PCB connectors include Flat Flexible Cable (FFC) headers, stacking connectors, Peripheral Component Interconnect (PCI) Express connectors, and mezzanine connectors, for example. Despite the abundance of such PCB connectors in electronic devices, there are no suitable ICT solutions for testing them due to the unique challenges presented. For example, the soldered pins of the PCB connectors are often hidden by connector covers, and therefore are not readily accessible for testing. Further, the PCB connectors may be placed in dense PCBA environment, which makes placing of access points for pogo pins impractical.

Conventional contact probe solutions, such as bed of nails and Virtual Tunnel End Point (VTEP), require access points for test probes to physically touch the PCBA. Due to ever increasing component density and copper trace density on the PCBAs, there is very limited space or no space available on the PCBA for the access points. In such cases, existing contact probe solutions cannot work. Other conventional techniques, such as boundary scan, require the DUT to be powered up during testing for defects. Such powered DUT techniques are mainly suitable for specific integrated circuit (IC) packages, and are unscalable to cover several connectors in a PCBA. However, powering up the DUT for testing while uncorrected defects exist could potentially lead to irreversible damage to the DUT. Additional common limitations include complex data analyses, time-consuming scanning and measurement, high frequency circuitry, low robustness, insufficient defect sensitivity resolution, and high cost.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 1A is a simplified perspective view of a sensor device for detecting electrical defects in a DUT, according to a representative embodiment.

DETAILED DESCRIPTION

Figure 1B:
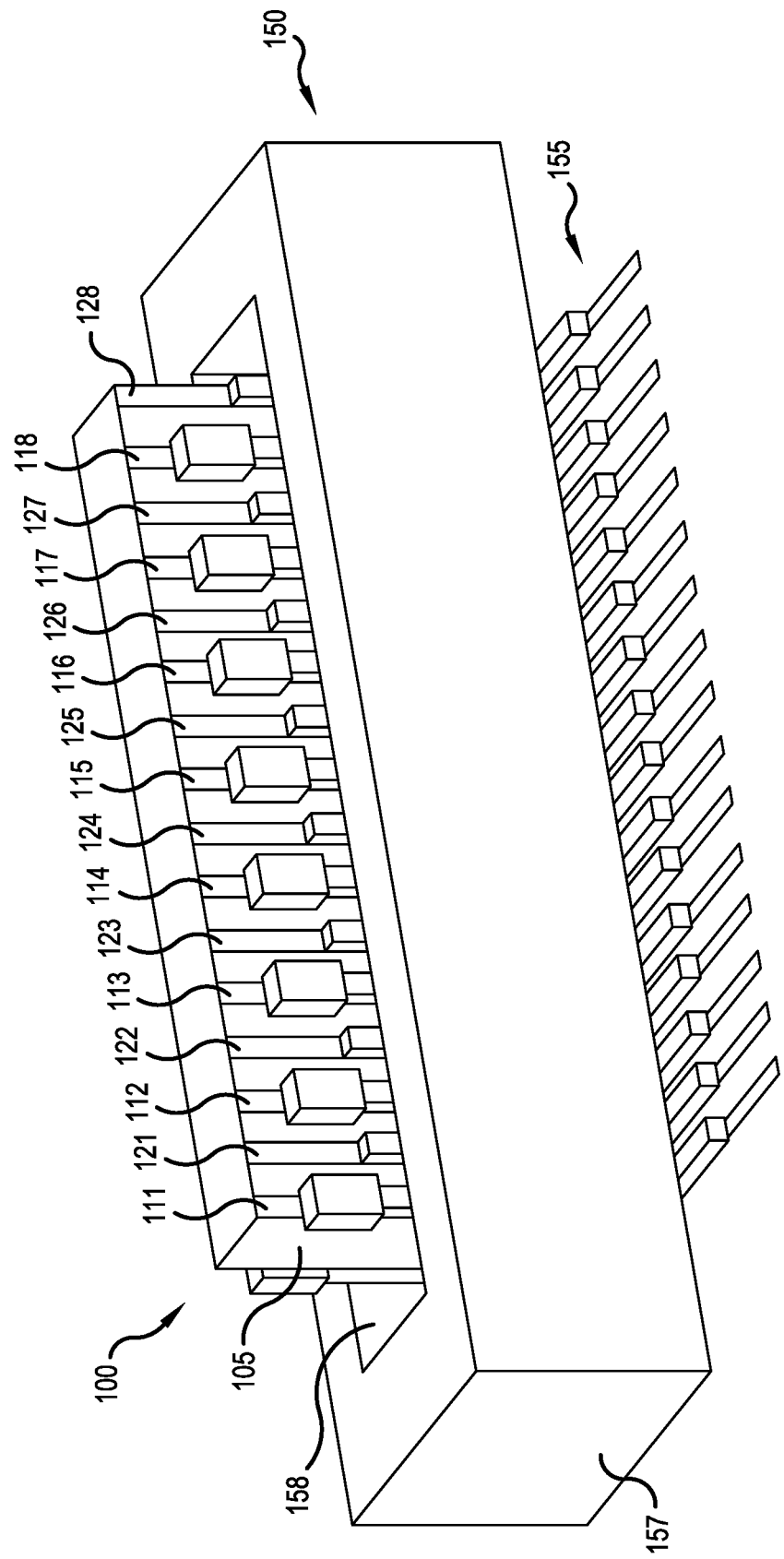
FIG. 1B is a simplified perspective view of the sensor device inserted in the DUT, according to a representative embodiment.

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms "a", "an" and "the" include both singular and plural referents, unless the context clearly dictates otherwise. Thus, for example, "a device" includes one device and plural devices. As used in the specification and appended claims, and in addition to their ordinary meanings, the terms "substantial" or "substantially" mean to within acceptable limits or degree. As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Relative terms, such as "above," "below," "top," "bottom," may be used to describe the various elements" relationships to one another, as illustrated in the accompanying drawings. These relative terms are intended to encompass different orientations of the elements thereof in addition to the orientation depicted in the drawings. For example, if a sensor device (e.g., a probe) depicted in a drawing were inverted with respect to the view in the drawings, an element described as "above" another element, for example, would now be "below" that element. Similarly, if the apparatus were rotated by 90° with respect to the view in the drawings, an element described "above" or "below" another element would now be "adjacent" to the other element; where "adjacent" means either abutting the other element, or having one or more layers, materials, structures, etc., between the elements.

Generally, according to various embodiments, a sensor device is able to detect open defects and/or short defects (faults) in an electrical circuit, referred to herein as a device under test (DUT). For example, open and/or short defects may occur at soldering joints of the DUT. The DUT may be a printed circuit board assembly (PCBA) or an IC, for example, although the various embodiments may be used to test other types of DUTs having electrical circuitry, without departing from the scope of the present teachings. The various embodiments may be used, for example, to test the integrity of electrically conductive metallic traces on a PCB assembly and/or solder connections between the traces and pins of connector components on a PCB assembly. With regard to solder connections in particular, an open defect may be detected when a soldering joint fails to contact a corresponding pin and a short defect may be detected when adjacent soldering joints run together electrically connecting the corresponding pins and/or traces.

The sensor device detects open and short circuit faults without the necessity of access points or pogo pins. Further, the sensor device enables unpowered testing in that it does not require the DUT to be powered on to perform measurements. Also, the sensor device may be used for testing PCB connectors, such as FFC headers, stacking connectors, PCI Express connectors, and mezzanine connectors, for example, which do not have conventional ICT solutions. Additionally, since PCB connectors form continuous circuits with connected components of the PCBA, such as ICs and bond wires, the sensor device may also detect faults on these structures when the ICs are connected to the PCB connectors.

According to a representative embodiment, a sensor device is provided for detecting electrical defects in a DUT. The sensor device includes a signal line configured to conduct a stimulus signal through a first conductor in the DUT; an inductor connected in series with the signal line for providing an inductance; and a ground line arranged adjacent to the signal line and configured to provide a ground path through a second conductor in the DUT for the stimulus signal conducted through the signal line and the first conductor. A resonance frequency for the signal line is determined based on the inductance and an effective capacitance of the signal line generated in response to the stimulus signal. An increase in the resonance frequency indicates an open defect in the first conductor and/or the second conductor, and a decrease in the resonance frequency indicates a short defect between the first conductor and the second conductor.

According to another representative embodiment, a sensor device is provided for detecting electrical defects in a DUT. The sensor device includes multiple signal lines configured to conduct stimulus signals through corresponding first conductors in the DUT; at least one inductor connected in series with the signal lines for providing at least one inductance; multiple ground lines configured to provide ground paths through corresponding second conductors in the DUT for the stimulus signals conducted through the signal lines and the first conductors, where the ground lines are arranged adjacent to the signal lines, respectively; and a multiplexer configured to selectively provide the stimulus signals to the signal lines, respectively. In response to the stimulus signals, capacitive couplings are generated between the signal lines and the adjacent ones of the ground lines, between the signal lines and the corresponding first conductors, between the ground lines and the corresponding second conductors, and between the first conductors and adjacent ones of the second conductors, where the capacitive couplings collectively provide effective capacitances corresponding to the signal lines, respectively. Resonance frequencies of the signal lines are determined based on the at least one inductance and the corresponding effective capacitances. For each signal line, an increase in the resonance frequency indicates an open defect in the corresponding first conductor or one of the second conductors adjacent to the corresponding first conductor, and a decrease in the resonance frequency indicates a short defect between the corresponding first conductor and one of the second conductors adjacent to the corresponding first conductor.

According to another representative embodiment, a system is provided for detecting electrical defects in a DUT having a first conductor and a second conductor arranged adjacent to the first conductor. The system includes a signal source configured to generate a stimulus signal, and a sensor device configured to apply the stimulus signal to the first conductor and the second conductor of the DUT. The sensor device includes a signal line configured to conduct the stimulus signal through the first conductor; an inductor connected in series with the signal line for providing an inductance; and a ground line arranged adjacent to the signal line and configured to provide a ground path through the second conductor for the stimulus signal conducted through the signal line and the first conductor. The system further includes a processing unit, and a memory for storing instructions that, when executed by the processing unit, cause the processing unit to measure a resonance frequency for the signal line based on the inductance and an effective capacitance of the signal line generated in response to the stimulus signal, identify an open defect in the first conductor and/or the second conductor when the resonance frequency is higher than a reference resonance frequency, identify a short defect between the first conductor and the second conductor when the resonance frequency is lower than the reference resonance frequency, and identify normal first and second conductors when the resonance frequency is within a threshold range for the reference resonance frequency.

FIG. 1A is a simplified perspective view of a sensor device for detecting electrical defects in a DUT, and FIG. 1B is a simplified perspective view of the sensor device inserted in the DUT, according to a representative embodiment.

Referring to FIGS. 1A and 1B, a sensor device 100 includes an insertion card 105 insertable into an opening 158 of an open gap connector 157 on a representative DUT 150, which may be a PCB or a PCB assembly, for example. The sensor device 100 may be a test probe, for example. The insertion card 105 may also be a PCB, for example, formed of FR-4 epoxy laminate or other compatible dielectric substrate material. The DUT 150 includes conductors 155 comprising corresponding pin portions 156 within the opening 158 of the open gap connector 157 and corresponding traces 154 electrically connected to the pin portions 156. The conductors 155 in the DUT 150 may also include soldering joints, for example, joining the pin portions 156 with respective traces 154. The conductors 155 may further include bond wires from additional circuitry, such as an IC package and/or chip, for example, as discussed below with reference to FIG. 6. The bond wires may be connected between pin portions of the additional circuitry and internal die chips, and the pin portions of the additional circuitry may then be connected to traces 154, for example.

In the depicted embodiment, the sensor device 100 includes multiple signal lines 111, 112, 113, 114, 115, 116, 117 and 118 and multiple ground lines 121, 122, 123, 124, 125, 126, 127 and 128 arranged alternately between the signal lines 111-118, respectively. The signal lines 111-118 and the ground lines 121-128 may be copper, gold, aluminum, or other compatible electrically conductive material formed on the surface of the substrate material of the insertion card 105, for example. When the insertion card 105 is inserted in the opening 158, as shown in FIG. 1B, the signal lines 111-118 and the ground lines 121-128 contact respective ones of the conductors 155 at sensor tip 103 of the insertion card 105. "Contact" means that the signal lines 111-118 and the ground lines 121-128 may physically touch the conductors 155, e.g., at the pin portions 156, respectively, or may form strong capacitive couplings with the conductors 155 without physically touching them. When the signal lines 111-118 do not physically touch the conductors 155, the stimulus signals are conducted through the conductors 155 via the second capacitive couplings. Likewise, when the ground lines 121-128 do not physically touch the conductors 155, the respective ground paths are provided through the conductors 155 via the third capacitive couplings. In the depicted embodiment, the signal lines 111-118 and the ground lines 121-128 may be electrically connected to the corresponding pin portions 156 in the opening 158 of the open gap connector 157, as mentioned above, and are therefore considered to be in contact with the conductors 155.

The sensor device 100 further includes inductors 131, 132, 133, 134, 135, 136, 137 and 138 connected to the signal lines 111-118, respectively, to provide corresponding inductances. The inductors 131-138 may be surface mounted devices (SMDs), for example. The inductors 131-138 are connected in series between a signal source (not shown) and contact ends of the signal lines 111-118 at the sensor tip 103. The signal source may be an RF signal source included in a vector network analyzer (VNA), for example, and is configured to provide a stimulus signal (e.g., voltage signal), although any compatible RF signal source may be incorporated without departing from the scope of the present teachings. Notably, the inductors 131-138 are representative of corresponding inductances, and even though they are shown as single inductors, it is understood that each of the inductors 131-138 may be implemented using one or more inductors connected in series. In alternative embodiments, the signal lines 111-118 may share one or more inductors, without departing from the scope of the present teachings. For example, a single inductor may be connected between the signal source and all of the signal lines 111-118, or single inductors may be connected between the signal source and pairs of the signal lines 111-118 for a total of four inductors. Also, in an embodiment, the same arrangement of signal lines 111-118, ground lines 121-128, and inductors 131-138 may be provided on the opposite side of the insertion card 105.

When the insertion card 105 of the sensor device 100 is inserted in the opening 158, the signal lines 111-118 and the ground lines 121-128 contact respective pin portions 156 of the conductors 155, respectively. A stimulus signal is applied by the signal source, the signal lines 111-118 conduct the stimulus signal through the conductors 155 with which they are in contact to provide respective excitation paths, and the ground lines 121-128 conduct the return signal through adjacent ones of the conductors 155 with which they are in contact to provide respective return paths to ground. For example, the signal line 111 may conduct the stimulus signal through a first conductor 155-1 of the conductors 155 in the DUT 150, and the adjacent ground line 121 may conduct the return signal through a second conductor 155-2 of the conductors 155, the second conductor 155-2 being adjacent to the first conductor 155-1. Thus, a complete circuit is provided through the signal line 111 (and the series connected inductor 131), the first conductor 155-1, the second conductor 155-2, and the ground line 121.

The stimulus signal may be applied to the signal lines 111-118 simultaneously, in groups of two or more at a time, or one at a time. This may be done using one or more multiplexers (not shown) or one or more switches (not shown), for example, connected to the signal lines 111-118 and/or the ground lines 121-128 of the sensor device 100. For example, a multiplexer may be configured to receive the stimulus signal from the signal source, and to apply the stimulus signal consecutively to each of the signal lines 111-118, and/or to receive return signals from the ground lines 121-128 and to connect the return signals to ground. When multiplexers and/or switches are connected to both the signal source and ground, they may be operated cooperatively to selectively connect pairs or complementary groups of signal lines 111-118 and ground lines 121-128 between the signal source and ground, tuning the sensitivity of the sensor device 100. Operation of the multiplexers and/or switches may be controlled by a processing unit, such as processing unit 710 discussed below with reference to FIG. 7, for example.

The presence of open defects and short defects in the DUT 150 will change parameters of an equivalent circuit, as discussed below. These are reflected by effective impedance and thus may be detected through measurement of resonance frequency. For example, for the signal line 111, the resonance frequency is determined based on the inductance and an effective capacitance of the signal line 111 generated in response to the stimulus signal. An increase in the resonance frequency indicates an open defect in the first conductor 155-1 and/or the second conductor 155-2, and a decrease in the resonance frequency indicates a short defect between the first and second conductors 155-1 and 155-2. The resonance frequency may be measured by a VNA, for example, connected to the sensor device 100, although any compatible test instrument capable of measuring resonance frequency may be incorporated without departing from the scope of the present teachings.

Figure 2A:
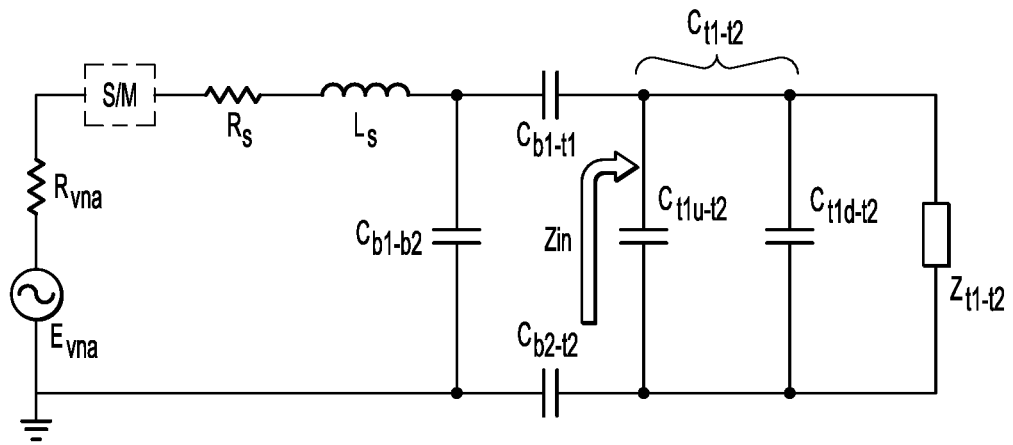
FIG. 2A shows an equivalent circuit of a sensor device connected to a DUT when there are no open or short defects, according to a representative embodiment.

When operated, the sensor device 100 and the DUT 150 together form an equivalent circuit, including various capacitances that are induced by application of the stimulus signal, and that depend in part on the presence or absence of open and short defects. FIG. 2A shows an equivalent circuit of a sensor device connected to a DUT when there are no open or short defects, and FIG. 2B shows corresponding capacitive couplings in the involved portion of the sensor device, according to a representative embodiment.

Figure 2B:
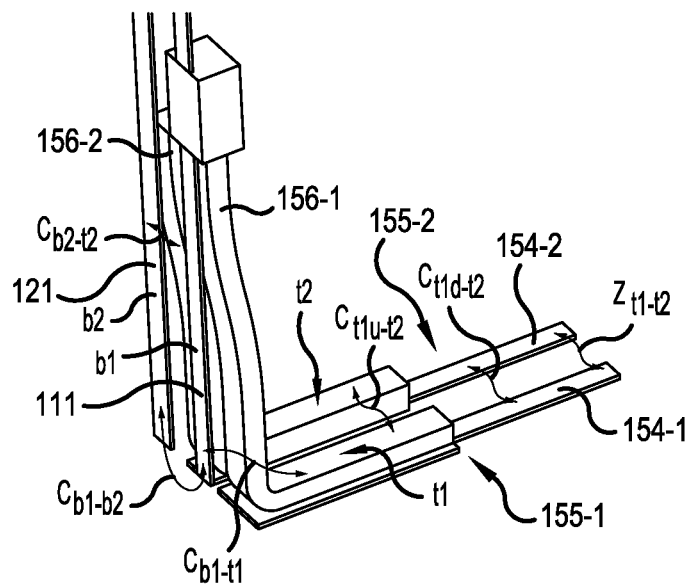
FIG. 2B shows corresponding capacitive couplings in the involved portion of the sensor device, according to a representative embodiment.

Referring to FIGS. 2A and 2B, representative signal line 111 (b1) of the sensor device 100 is coupled with the first conductor 155-1 (t1) of the DUT 150, and representative ground line 121 (b2) of the sensor device 100 is coupled with the second conductor 155-2 (t2) of the DUT 150. The signal and ground lines 111 and 121 are adjacent to one another, and the first and second conductors 155-1 and 155-2 are adjacent to one another, as discussed above. The first conductor 155-1 includes a first pin portion 156-1 and a first trace 154-1 which may be joined by a first soldering joint, and the second conductor 155-2 includes a second pin portion 156-2 and a second trace 154-2 which may be joined by a second soldering joint. There are no open or short defects, so operation of the sensor device 100 in FIGS. 2A and 2B provide a reference resonance frequency.

The equivalent circuit includes signal source $E_{vna}$ and resistance $R_{vna}$, where the resistance $R_{vna}$ may be the 50 ohms output impedance of the signal source $E_{vna}$. Resistance $R_S$ (sensor resistance) and inductance $L_S$ (sensor inductance) are connected in series between the signal source $E_{vna}$ and the equivalent impedance $Z_{in}$ looking into the first and second conductors 155-1 and 155-2 of the DUT 150. The equivalent circuit may also include a representative switch or multiplexer S/M (optional) that, when included in or connected to the sensor device 100, is configured to selectively provide the stimulus signals from the signal source $E_{vna}$ to the signal lines 111-118 (including signal line 111), respectively. Alternatively, or in addition, the equivalent circuit may include an optional switch or multiplexer S/M (not shown) between ground and the other circuit elements in order to selectively connect the ground lines 121-128 (including ground line 121) to ground, respectively.

The capacitive coupling between the signal line 111 (b1) and the ground line 121 (b2) is indicated by capacitance $C_{b1-b2}$ (first capacitive coupling). Also, the capacitive coupling between the signal line 111 (b1) and the adjacent first conductor 155-1 (t1) is indicated by capacitance $C_{b1-t1}$ (second capacitive coupling), and the capacitive coupling between the ground line 121 (b2) and the adjacent second conductor 155-2 (t2) is indicated by capacitance $C_{b2-t2}$ (third capacitive coupling). The capacitive coupling between the first and second conductors 155-1 (t1) and 155-2 (t2) is indicated by capacitance $C_{t1-t2}$ (fourth capacitive coupling). For purposes of explanation, the capacitance $C_{t1-t2}$ in FIG. 2A is represented by parallel arrangement (sum) of the capacitance $C_{t1u-t2}$ between the first conductor 155-1 upside and the second conductor 155-2 and the capacitance $C_{t1d-t2}$ between the first conductor 155-1 downside and the second conductor 155-2. In the depicted example, the first conductor upside t1u represents the first pin portion 156-1 of the first conductor 155-1, and the first conductor downside t1d represents the first trace 154-1 of the first conductor 155-1. Impedance $Z_{t1-t2}$ is the residual impedance between the first and second conductors 155-1 and 155-2, excluding the capacitance coupling $C_{t1-t2}$.

Therefore, based on the equivalent circuit shown in FIG. 2A, and assuming that $C_{b1-t1}=C_{b2-t2}$, and that $Z_{t1-t2}=\infty$ (open end), the resonance frequency $f_r$ for the reference case may be determined according to Expression (1), where $L_S$ is inductance of the sensor device (mentioned above) and $C_S$ is effective capacitance of the sensor device:

$$f_r = \frac{1}{2\pi\sqrt{L_S C_S}} \quad (1)$$

The effective capacitance $C_S$ of the sensor device may be determined according to Expression (2):

$$C_S = C_{b1-b2} + \frac{C_{b1-t1}C_{t1-t2}}{2C_{t1-t2} + C_{b1-t1}} \quad (2)$$

Generally, since $\partial C_S/\partial C_{t1-t2}>0$, a higher capacitive coupling between the first and second conductors 155-1 and 155-2 will increase the effective capacitance $C_S$ and reduce the resonance frequency $f_r$ of the sensor device, and a lower capacitive coupling between the first and second conductors 155-1 and 155-2 will decrease the effective capacitance $C_S$ and increase the resonance frequency $f_r$ of the sensor device.

Figure 3A:
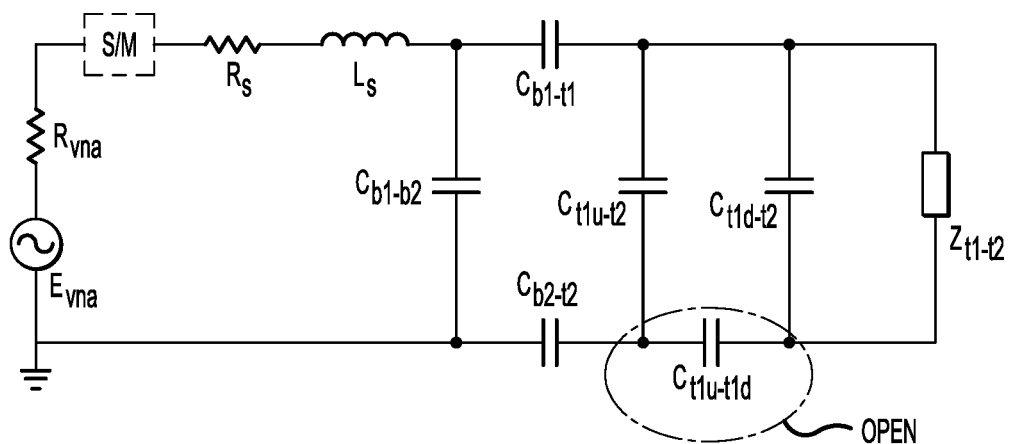
FIG. 3A shows an equivalent circuit of a sensor device connected to a DUT having an open defect, according to a representative embodiment.
Figure 3B:
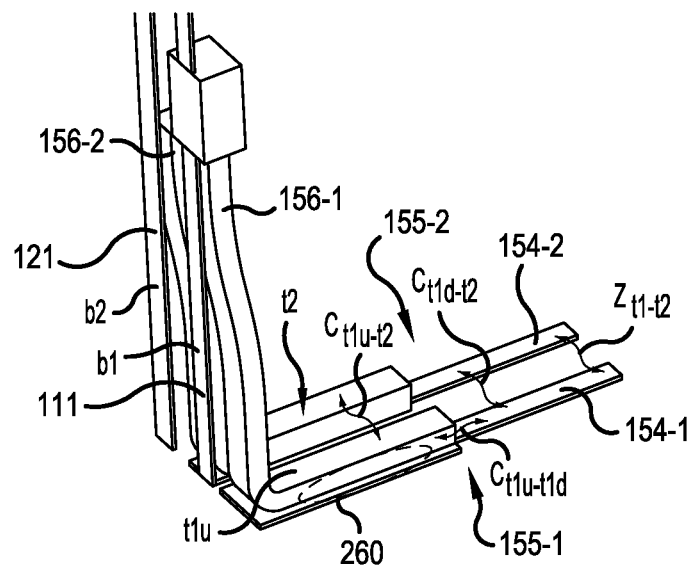
FIG. 3B shows corresponding capacitive couplings in the involved portion of the sensor device, according to a representative embodiment.

FIG. 3A shows an equivalent circuit of a sensor device connected to a DUT when there is an open defect, and FIG. 3B shows corresponding capacitive couplings in the involved portion of the sensor device, according to a representative embodiment. Referring to FIGS. 3A and 3B, an open defect (e.g., a crack) is shown on the first conductor 155-1, which may be a defect in the soldering joint between the first pin portion 156-1 and the first trace 154-1, for example. The open defect is represented in the equivalent circuit by open capacitance $C_{t1u-t1d}$ in FIG. 3A, and is indicated in the first conductor 155-1 by dashed circle 260 in FIG. 3B. When there is such an open defect in the first conductor 155-1, the first conductor 155-1 is divided into two parts: the first conductor upside t1u representing the first pin portion 156-1, and the first conductor downside t1d representing the first trace 154-1, as discussed above. Accordingly, the original coupling capacitance $C_{t1-t2}$ between the first and second conductors 155-1 (t1) and 155-2 (t2) is cut off by the open capacitance $C_{t1u-t1d}$, causing the effect of the capacitance $C_{t1d-t2}$ to be significantly reduced in the measurement (effectively disappearing), e.g., as indicated in Expression (4), below. Assuming the open capacitance $C_{t1u-t1d}$ is equal to $kC_{t1d-t2}$ (where k is a positive number), so the effective capacitance $C_s^o$ of the sensor device for the open defect case may be determined according to Expression (3):

$$C_s^O = C_{b1-b2} + \frac{C_{b1-t1}C_{t1-t2}^O}{2C_{t1-t2}^O + C_{b1-t1}} \quad (3)$$

The capacitance $C_{t1-t2}^o$ is the open defect capacitance, which satisfies the relationship according to Expression (4):

$$C_{t1-t2}^O = C_{t1u-t2} + \frac{C_{t1u-t1d}C_{t1d-t2}}{C_{t1u-t1d} + C_{t1d-t2}} = $$
$$C_{t1u-t2} + \frac{k}{k+1}C_{t1d-t2} < C_{t1u-t2} + C_{t1d-t2} = C_{t1-t2} \quad (4)$$

That is, when an open defect occurs, $C_{t1-t2}$ becomes $C_{t1-t2}^o$, and $C_S$ becomes $C_s^o$ and thus Expression (2) becomes Expression (3), proving that $\partial C_S/\partial C_{t1-t2}>0$. Expression (4) shows that $C_{t1-t2}^o$ is less than $C_{t1-t2}$, so the equivalent total capacitance decreases and the resonance frequency increases. In other words, the open defect will reduce the effective capacitive coupling between the first and second conductors 155-1 and 155-2, and increase the resonance frequency $f_r$ of the sensor device 100.

Figure 4A:
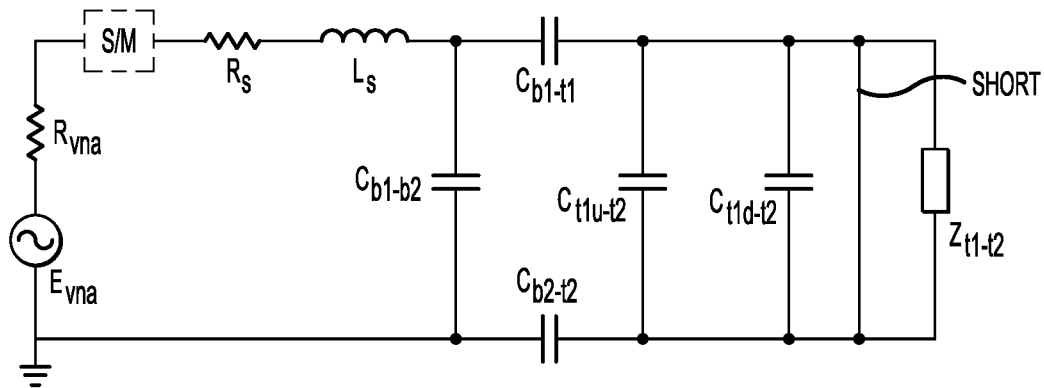
FIG. 4A shows an equivalent circuit of a sensor device connected to a DUT having a short defect, according to a representative embodiment.
Figure 4B:
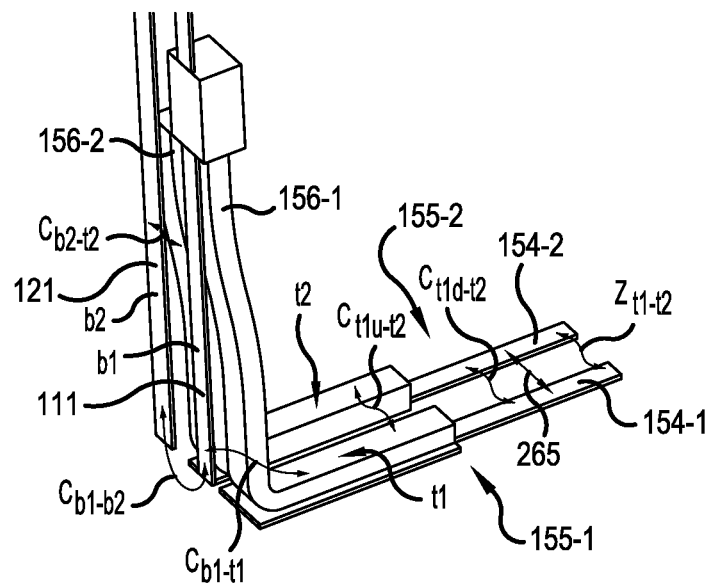
FIG. 4B shows corresponding capacitive couplings in the involved portion of the sensor device, according to a representative embodiment.

FIG. 4A shows an equivalent circuit of a sensor device connected to a DUT when there is a short defect, and FIG. 4B shows corresponding capacitive couplings in the involved portion of the sensor device, according to a representative embodiment. Referring to FIGS. 4A and 4B, a short defect (e.g., stray solder) is shown between the first conductor 155-1 and the second conductor 155-2. The short defect is represented in the equivalent circuit by the "Short" line connected in parallel with the impedance $Z_{t1-t2}$ in FIG. 4A, and is indicated by arrow 265 joining the first and second conductors 155-1 and 155-2 in FIG. 4B. That is, when a short defect occurs, the original first and second conductors 155-1 and 155-2 are shorted together, and effectively merge as a single conductor t. The effective capacitive coupling between the first and second conductors 155-1 and 155-2 becomes infinite, thereby reducing the resonance frequency of the sensor device 100.

Notably, referring to FIGS. 2A, 3A and 4A, the capacitances $C_{b1-t1}$ and $C_{b2-t2}$ increase as the sensor tip 103 at the ends of the signal line 111 and the ground line 121 gets closer to the first conductor 155-1 and the second conductor 155-2, resulting in increased sensitivity of the sensor device 100. The maximum sensitivity will appear at the condition when the sensor tip 103 is in electrical contact with the DUT 150 conductors (e.g., the upper pin portions 156). Further, when the impedance $Z_{t1-t2}$ is modeled as an inductor or a resistor, an open defect will continue to cause a significant change to the equivalent impedance $Z_{in}$ of the adjacent conductors and detected by the resonance frequency shift.

Figure 5:
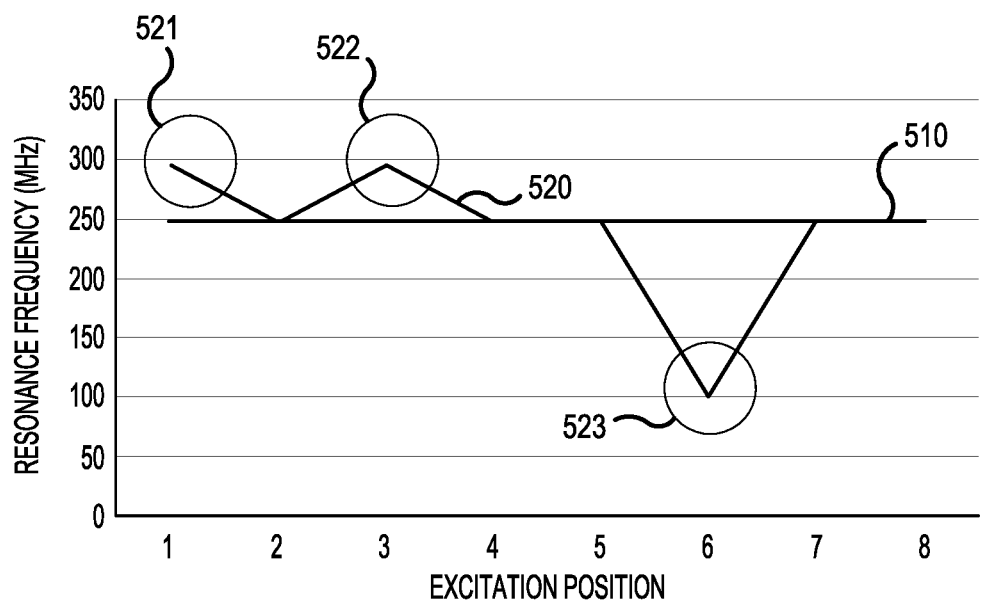
FIG. 5 is a graph showing resonance frequencies as a function of excitation positions of the sensor device for no defect, open defects and a short defect, according to a representative embodiment.

FIG. 5 is a graph of simulation results showing resonance frequencies in MHz as a function of excitation positions of the sensor device for no defect, open defects and a short defect, according to a representative embodiment.

Referring to FIG. 5, eight resonance frequency results are obtained for eight excitation positions 1-8, which correspond to the signal lines 111-118 in FIGS. 1A and 1B, respectively. The ground lines 121-128 also correspond to different excitation positions in this example. Moreover, all of the inductors 131-138 have the same inductance value of 1 µH, for example. Trace 510 indicates the reference resonance frequency when the DUT 150 has no open defects and no short defects. In this case, the resonance frequency is almost the same (about 250 MHz) at each of the excitation positions 1-8, in the depicted example. Trace 520 indicates the resonance frequency when the DUT 150 has open and short defects. In the depicted example, there are 0.01 mm open defects in signal lines 111 and 113, corresponding to excitation positions 1 and 3, respectively. There is also a short defect between signal line 116, corresponding to excitation position 6, and adjacent ground line 126. Accordingly, the resonance frequency is higher (about 300 MHz) at excitation positions 1 (521) and 3 (522), indicating the open defects, and the resonance frequency is lower (about 100 MHz) at excitation position 6 (523), indicating the short defect. Trace 520 at the remaining excitation positions is at the reference resonance frequency (about 250 MHz), indicating no open or short defects. In the illustrative design, the excitation position 1 can cover signal line 111 and ground line 121, the excitation position 2 can cover signal line 112 and ground line 122, and the excitation position 6 can cover signal line 116 and ground line 126.

Figure 6:
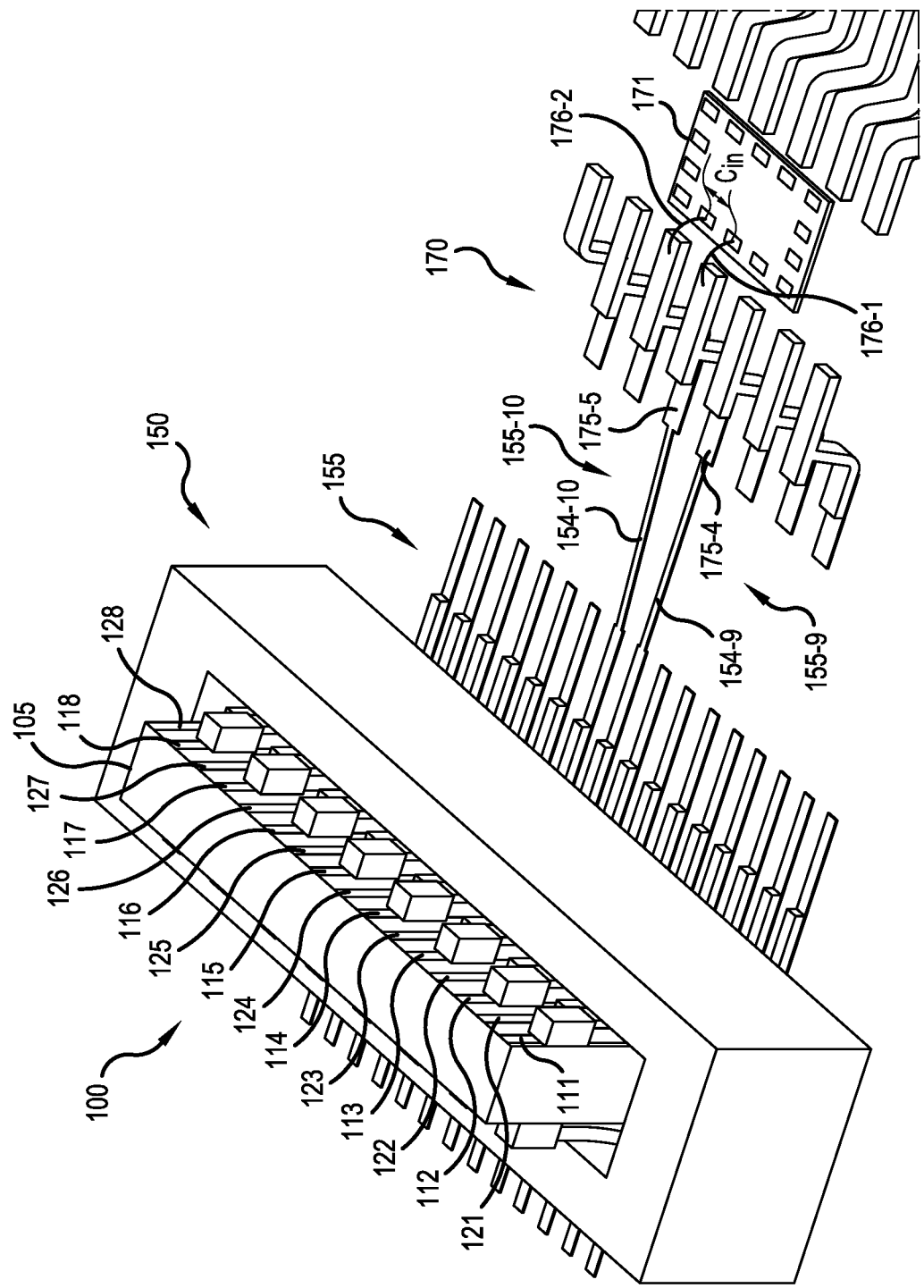
FIG. 6 is a simplified perspective view of the sensor device inserted in the DUT connected to an IC package, according to a representative embodiment.

FIG. 6 is a simplified perspective view of the sensor device inserted in the DUT connected to an IC package, according to a representative embodiment.

Referring to FIG. 6, the DUT 150 is connected to an IC package 170 through the conductors 155, such that the conductors 155 further include circuitry (e.g., IC traces, bond wires, etc.) of the IC package 170. More particularly, in the depicted example, the DUT 150 is connected to an IC package 170 through extensions of a ninth trace 154-9 of a ninth conductor 155-9 and a tenth trace 154-10 of a tenth conductor 155-10 of the conductors 155, which are connected to IC trace 175-4 and IC trace 175-5, respectively. Internal to the IC package 170 is representative chip 171, which may be a microcontroller, for example. In the depicted example, the IC trace 175-4 is connected to a bond pad (or pin) on the chip 171 through bond wire 176-1, and the IC trace 175-5 is connected to an adjacent bond pad on the chip 171 through bond wire 176-2. There is a bond wire coupling capacitance $C_{in}$ induced between the bond wires 176-1 and 176-2 in response to the stimulus signal received from the sensor device 100 via the signal line 115 and the ninth conductor 155-9.

Since open defects and short defects present on the bond wires 176-1 and 176-2 may change of the effects from the coupling between the two respective bond pads, these open defects and short defects may be detected with the same detection principle discussed above, where open defects increase the resonance frequency and short defects decrease the resonance frequency of the sensor device 100. For example, an open defect on the bond wire 176-1 may cause effects of the bond wire coupling capacitance $C_{in}$ to be significantly reduced in the measurement, enabling detection of the open defect by the sensor device 100, as is the case with the capacitance $C_{t1d-t2}$ discussed above with reference to FIGS. 3A and 3B. Similarly, a short defect between the bond wires 176-1 and 176-2 results in an effective capacitive coupling between the bond wires 176-1 and 176-2 (and by extension the ninth and tenth conductors 155-9 and 155-10) becomes infinite, thereby reducing the resonance frequency of the sensor device 100.

Figure 7:
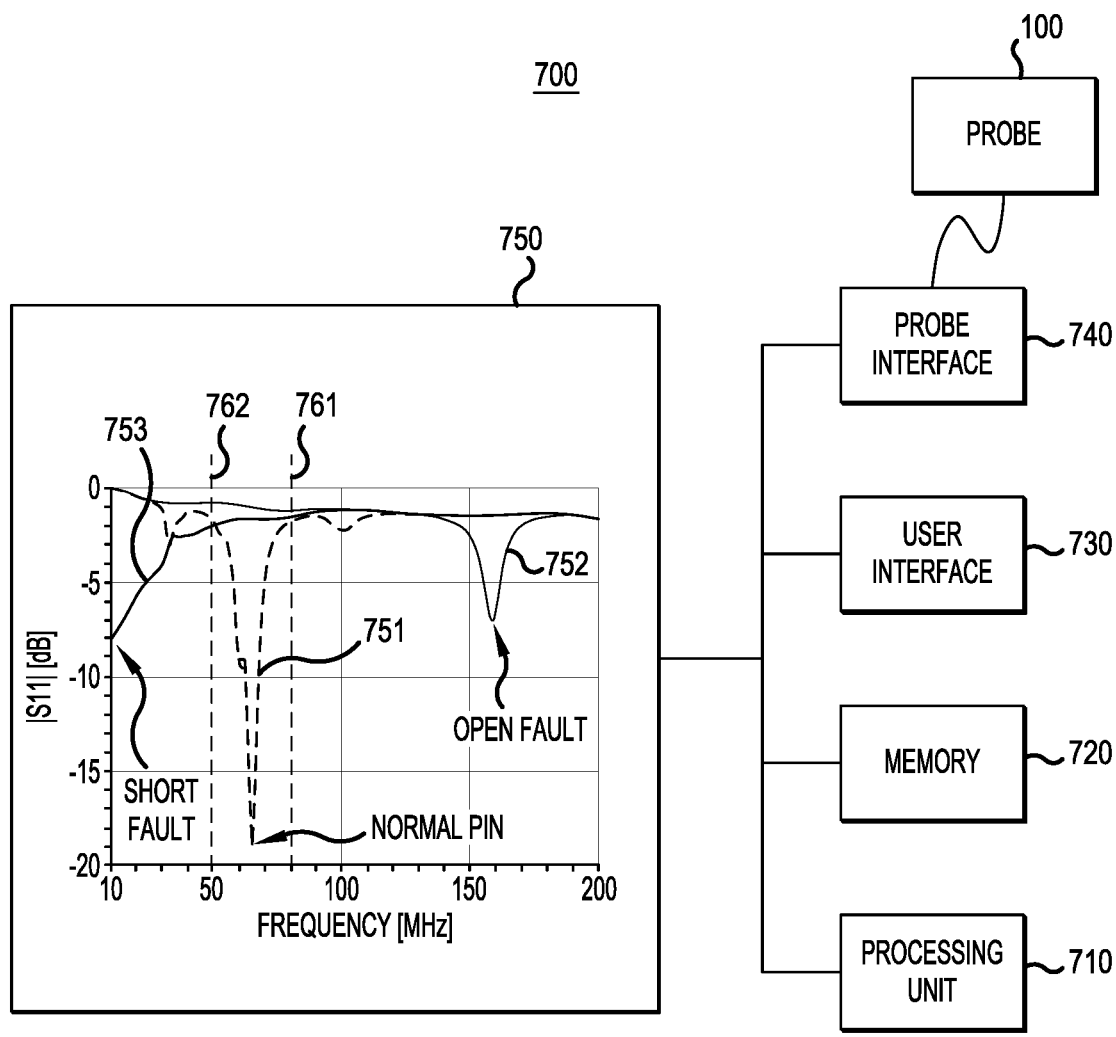
FIG. 7 is a simplified block diagram for a system including a sensor device for detecting electrical defects in a DUT and a display of a graph of measurement results showing frequency responses of reflection coefficients, according to a representative embodiment.

FIG. 7 is a simplified block diagram a system including a sensor device for detecting electrical defects in a DUT, and a display of a graph of measurement results showing frequency responses of reflection coefficients, according to a representative embodiment.

Referring to FIG. 7, system 700 includes a processing unit 710 and memory 720 for storing instructions executable by the processing unit 710 to implement the processes described herein. The system 700 further includes a user interface 730 for interfacing with a user, a sensor device interface 740 for interfacing with the sensor device 100, for example, which may also be considered part of the system 700, and a display 750 configured to display at least the resonance frequencies measured by the sensor device 100, as discussed below. In various embodiments, all or part of the system 700 may be implemented in a test instrument, such as a VNA, for example.

The processing unit 710 is representative of one or more processing devices, and is configured to execute software instructions to perform functions as described in the various embodiments herein. The processing unit 710 may be implemented by a server, a general purpose computer, a central processing unit, one or more processors, microprocessors or microcontrollers, a state machine, a programmable logic device, field programmable gate arrays (FPGAs), application specific integrated circuits (ASICs), or combinations thereof, using any combination of hardware, software, firmware, hard-wired logic circuits, or combinations thereof. As such, the term "processing unit" encompasses an electronic component able to execute a program or machine executable instructions, may be interpreted to include more than one processor or processing core, as in a multi-core processor and/or parallel processors.

The memory 720 may communicate with the processing unit 710 via one or more buses. The memory 720 stores instructions used to implement some or all aspects of methods and processes described herein. The memory 720 may be implemented by any number, type and combination of random access memory (RAM) and read-only memory (ROM), for example, and may store various types of information, such as software algorithms, data based models including artificial neural networks (ANNs) and other neural network based models, and computer programs, all of which are executable by the processing unit 710. The various types of ROM and RAM may include any number, type and combination of computer readable storage media, such as a disk drive, flash memory, an electrically programmable read-only memory (EPROM), an electrically erasable and programmable read only memory (EEPROM), registers, a hard disk, a removable disk, tape, compact disk read only memory (CD-ROM), digital versatile disk (DVD), floppy disk, blu-ray disk, a universal serial bus (USB) drive, or any other form of computer readable storage medium known in the art. The memory 720 is tangible, and is non-transitory during the time software instructions are stored therein. The memory 720 may store software instructions and/or computer readable code that enable performance of various functions.

The user interface 730 provides information and data output by the processing unit 710 to the user and/or receives information and data input by the user. That is, the user interface 730 enables the user to enter data and to control or manipulate aspects of the processes described herein, and also enables the processing unit 710 to indicate the effects of the user's control or manipulation. The user interface 730 may include a mouse, a keyboard, a trackball, a joystick, a haptic device, a touchpad, a touchscreen, and/or voice or gesture recognition captured by a microphone or video camera, for example, or any other peripheral or control to permit user feedback from and interaction with the processing unit 710.

The display 750 may be a monitor such as a computer monitor, a television, a liquid crystal display (LCD), an organic light emitting diode (OLED), a flat panel display, a solid-state display, or a cathode ray tube (CRT) display, or an electronic whiteboard, for example. The display 750 may also provide a graphical user interface (GUI) for displaying and receiving information to and from the user operating in conjunction with the user interface 730.

In the depicted example, the display 750 displays a graph of measured results showing the frequency response of reflection coefficient $S_{11}$ magnitude in decibels (dB). In the graph, trace 751 indicates a reference frequency response when the conductors of the DUT contacting the signal line and the return ground line of the sensor device 100 have no open defects and no short defects. In this example, the resonance frequency is about 65 Mhz, indicated by the minimum value of the reflection coefficient $S_{11}$ of about −19 dB. Trace 752 indicates the frequency response when at least one of the conductors of the DUT contacting the signal line and the return ground line has an open defect. In this example, the resonance frequency is about 160 MHz, which is higher than the reference resonance frequency, indicated by the minimum value of the reflection coefficient $S_{11}$ of about −7 dB. Trace 753 indicates the resonance frequency when there is a short defect between the conductor contacting the signal line and the conductor contacting the return ground line. In this example, the resonance frequency is less than 10 MHz, which is lower than the reference resonance frequency, indicated by the minimum value of the reflection coefficient $S_{11}$ of about −8 dB. In alternative configurations, the display 750 may be configured to display the resonance frequency as a function of magnitude or phase of the reflection coefficient $S_{11}$, or as a function of magnitude or phase of effective impedance of the sensor device 100.

In an embodiment, the presence of open defects and short defects may be determined automatically by the processing unit 710. That is, the memory 720 may store instructions that, when executed by the processing unit 710, cause the processing unit 710 to identify the reference resonance frequency, e.g., based on the reflection coefficient $S_{11}$. The instructions may further cause the processing unit 710 to establish a first frequency threshold 761 of a threshold range that is higher than the reference resonance frequency for identifying open defects and a second frequency threshold 762 of the threshold range that is lower than the reference resonance frequency for identifying short defects. In the depicted example, the first frequency threshold is established at 80 MHz and the second frequency threshold is established at 50 MHz. The processing unit 710 may determine the first and second frequency thresholds 761 and 762 by training a machine learning algorithm, such as an ANN model, using samples of frequency responses of the sensor device 100 obtained from conductors with no open or short defects, conductors with known open defects, and conductors with known short defects. Based on training data, a 95 percent to a 99 percent (the higher the better) confidence interval may be created for each of the cases (no defect, open defect, and short defect). The confidence interval is used to set up the frequency thresholds. When there is an overlap between confidence intervals, the design of the sensor device may be improved (optimized) by tuning parameters such as inductance values, sensor tip dimensions, and the like. Such optimizations may be done in simulation for faster results. Alternatively, the first and second frequency thresholds 761 and 762 may be entered by the user via the user interface 730.

With regard to the machine learning algorithm, the training data may be collected either by measurements on a particular DUT or using simulation models with different faults and no fault cases. Using the training data, a suitable machine learning algorithm may be developed for various fault classifications. Furthermore, the model for the machine learning algorithm can be applied to different DUT boards using a transfer learning approach.

The sensor device according to the embodiments described herein is able to detect open and short defects in DUT electrical circuits, such as PCB connectors, without the necessity of access points or VTEP capacitor plates, for example. Additionally, the sensor device may detect faults on IC bond wires or pins when the IC is connected to the DUT PCB connectors. The sensor device is an unpowered solution, meaning that it does not require the DUT (e.g., PCB or PCBA) to be powered up. This is a safer approach to identifying open and short defects since powering up the DUT for testing while an uncorrected defect exists may damage to the DUT. The sensor device can either be contactless or contact based solution. The contact approach improves sensitivity, while still not requiring access pins. Also, the sensor device is cost-effective in that it has a simple design which can be easily fabricated using existing PCB technology and utilizes commonly available passive SMD inductors.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A sensor device for detecting open and short circuit faults in a device under test (DUT), the sensor device comprising:
   a signal line configured to conduct a stimulus signal through a first conductor in the DUT;
   an inductor connected in series with the signal line for providing an inductance; and
   a ground line arranged adjacent to the signal line and configured to provide a ground path through a second conductor in the DUT for the stimulus signal conducted through the signal line and the first conductor,
   wherein frequency response is measured to determine a resonance frequency for the signal line based on the inductance and an effective capacitance of the signal line generated in response to the stimulus signal, and
   wherein an increase in the resonance frequency indicates an open circuit fault in the first conductor and/or the second conductor, and a decrease in the resonance frequency indicates a short circuit fault between the first conductor and the second conductor.

2. The sensor device of claim 1, wherein the effective capacitance is generated as a function of a first capacitive coupling generated between the signal line and the ground line, a second capacitive coupling generated between the signal line and the first conductor, a third capacitive coupling generated between the ground line and the second conductor, and a fourth capacitive coupling generated between the first conductor and the second conductor.

3. The sensor device of claim 2, wherein the signal line physically touches the first conductor for conducting the stimulus signal through the first conductor, and the ground line physically touches the second conductor for providing the ground path.

4. The sensor device of claim 2, wherein the signal line does not physically touch the first conductor, such that the stimulus signal is conducted through the first conductor via the second capacitive coupling, and
   wherein the ground line does not physically touch the second conductor, such that the ground path is provided through the second conductor via the third capacitive coupling.

5. The sensor device of claim 1, wherein the first and second conductors in the DUT comprise soldering joints joining traces and corresponding pin portions of the first and second conductors, respectively.

6. The sensor device of claim 1, wherein the first and second conductors in the DUT comprise bond wires.

7. The sensor device of claim 1, further comprising:
   an insertion card insertable into an opening of an open gap connector on the DUT,
   wherein the signal line and the ground line are formed on a surface of the insertion card, and
   wherein the signal line contacts the first conductor through the open gap connector, and the ground line contacts the second conductor through the open gap connector, when the insertion card is inserted in the opening.

8. A sensor device for detecting open and short circuit faults in a device under test (DUT), the sensor device comprising:
   a plurality of signal lines configured to conduct stimulus signals through a corresponding plurality of first conductors in the DUT;
   at least one inductor connected in series with the plurality of signal lines for providing at least one inductance;
   a plurality of ground lines configured to provide ground paths through a corresponding plurality of second conductors in the DUT for the stimulus signals conducted through the plurality of signal lines and the plurality of first conductors, wherein the plurality of ground lines are arranged adjacent to the plurality of signal lines, respectively; and
   at least one of a switch or a multiplexer configured to selectively provide the stimulus signals to the plurality of signal lines, respectively, and/or to selectively connect the plurality of ground lines to ground, respectively,
   wherein, in response to the stimulus signals, capacitive couplings are generated between the plurality of signal lines and adjacent ones of the plurality of ground lines, between the plurality of signal lines and the corresponding plurality of first conductors, between the plurality of ground lines and the corresponding plurality of second conductors, and between the plurality of first conductors and adjacent ones of the plurality of second conductors, wherein the capacitive couplings collectively provide effective capacitances corresponding to the plurality of signal lines, respectively,
   wherein frequency responses are measured to determine resonance frequencies of the plurality of signal lines based on the at least one inductance and the corresponding effective capacitances, and
   wherein, for each signal line of the plurality of signal lines, an increase in the resonance frequency indicates an open circuit fault in the corresponding first conductor or one of the plurality of second conductors adjacent to the corresponding first conductor, and a decrease in the resonance frequency indicates a short circuit fault between the corresponding first conductor and one of the plurality of second conductors adjacent to the corresponding first conductor.

9. The sensor device of claim 8, wherein the at least one inductor comprises a plurality of inductors connected in series with the plurality of signal lines, respectively.

10. The sensor device of claim 8, wherein the at least one inductor comprises one inductor connected in series with two or more of the plurality of signal lines.

11. The sensor device of claim 8, wherein the plurality of signal lines physically touch the plurality of first conductors for conducting the stimulus signals through the plurality of first conductors, and the plurality of ground lines physically touch the plurality of second conductors for providing the ground paths.

12. The sensor device of claim 8, wherein the plurality of signal lines do not physically touch the plurality of first conductors for conducting the stimulus signals through the plurality of first conductors, such that the stimulus signals are conducted through the plurality of first conductors via corresponding capacitive coupling, and the plurality of ground lines do not physically touch the plurality of second conductors for providing the ground paths, such that the ground paths are provided through the plurality of second conductors via corresponding capacitive couplings.

13. The sensor device of claim 8, further comprising:
an insertion card insertable into an opening of an open gap connector on the DUT,
wherein the plurality of signal lines and the plurality of ground lines are formed on a surface of the insertion card, and
wherein the plurality of signal lines contact the plurality of first conductors through the open gap connector, and the plurality of ground lines contact the plurality of second conductors through the open gap connector, when the insertion card is inserted in the opening.

14. A system for detecting open and short circuit faults in a device under test (DUT) having a first conductor and a second conductor arranged adjacent to the first conductor, the system comprising:
a signal source configured to generate a stimulus signal;
a sensor device configured to apply the stimulus signal to the first conductor and the second conductor of the DUT, the sensor device comprising:
a signal line configured to conduct the stimulus signal through the first conductor;
an inductor connected in series with the signal line for providing an inductance; and
a ground line arranged adjacent to the signal line and configured to provide a ground path through the second conductor for the stimulus signal conducted through the signal line and the first conductor;
a processing unit; and
a memory for storing instructions that, when executed by the processing unit, cause the processing unit to:
measure frequency response of the sensor device to determine a resonance frequency for the signal line based on the inductance and an effective capacitance of the signal line generated in response to the stimulus signal,
identify an open circuit fault in the first conductor and/or the second conductor when the resonance frequency is higher than a reference resonance frequency, identify a short circuit fault between the first conductor and the second conductor when the resonance frequency is lower than the reference resonance frequency, and
identify normal first and second conductors when the resonance frequency is within a threshold range for the reference resonance frequency.

15. The system of claim 14, wherein the instructions further cause the processing unit to determine a first frequency threshold of the threshold range higher than the reference resonance frequency, above which the resonance frequency identifies the open circuit fault, and to determine a second frequency threshold of the threshold range lower than the reference resonance frequency, below which the resonance frequency identifies the short circuit fault.

16. The system of claim 14, further comprising:
a display configured to display the resonance frequency as a function of reflection coefficient $S_{11}$.

17. The system of claim 14, further comprising:
a display configured to display the resonance frequency as a function of magnitude or phase of effective impedance of the sensor device, or magnitude or phase of reflection coefficient $S_{11}$.

18. The system of claim 14, wherein the effective capacitance is generated as a function of a first capacitive coupling generated between the signal line and the ground line, a second capacitive coupling generated between the signal line and the first conductor, a third capacitive coupling generated between the ground line and the second conductor, and a fourth capacitive coupling generated between the first conductor and the second conductor.

19. The system of claim 14, wherein the sensor device further comprises:
an insertion card insertable into an opening of an open gap connector on the DUT,
wherein the signal line and the ground line are formed on a surface of the insertion card, and
wherein the signal line contacts the first conductor through the open gap connector, and the ground line contacts the second conductor through the open gap connector, when the insertion card is inserted in the opening.

20. The system of claim 14, further comprising:
at least one of a multiplexer or a switch connected between the signal source and the signal line, and/or connected between ground and the ground line, wherein the at least one of the multiplexer or the switch is configured to selectively apply the stimulus signal to the signal line.

* * * * *